US008860483B2

(12) United States Patent
Wang et al.

(10) Patent No.: US 8,860,483 B2
(45) Date of Patent: Oct. 14, 2014

(54) PULSE WIDTH MODULATION SIGNAL GENERATION CIRCUIT AND PULSE WIDTH MODULATION SIGNAL GENERATION METHOD

(71) Applicants: Jo-Yu Wang, New Taipei (TW); Wei-Hsu Chang, New Taipei (TW)

(72) Inventors: Jo-Yu Wang, New Taipei (TW); Wei-Hsu Chang, New Taipei (TW)

(73) Assignee: Richtek Technology Corporation, Zhubei, Hsinchu (TW)

( * ) Notice: Subject to any disclaimer, the term of this patent is extended or adjusted under 35 U.S.C. 154(b) by 0 days.

(21) Appl. No.: 14/093,002

(22) Filed: Nov. 28, 2013

(65) Prior Publication Data
US 2014/0210534 A1 Jul. 31, 2014

(30) Foreign Application Priority Data

Jan. 25, 2013 (TW) .............................. 102102764 U

(51) Int. Cl.
*H03K 3/017* (2006.01)
*H03K 7/08* (2006.01)

(52) U.S. Cl.
CPC ........................................ *H03K 7/08* (2013.01)
USPC ............................................ 327/175; 327/172

(58) Field of Classification Search
None
See application file for complete search history.

(56) References Cited

U.S. PATENT DOCUMENTS

| 6,342,822 | B1 * | 1/2002 | So ................................. 332/109 |
| 6,828,836 | B1 * | 12/2004 | Barrow et al. ................. 327/172 |
| 7,710,214 | B2 * | 5/2010 | Li ................................. 332/109 |
| 7,772,903 | B2 | 8/2010 | Jiang et al. |
| 7,868,603 | B2 * | 1/2011 | Lacombe et al. ............. 323/285 |
| 2010/0201336 | A1 * | 8/2010 | Chen et al. .................... 323/285 |

* cited by examiner

*Primary Examiner* — Cassandra Cox
(74) *Attorney, Agent, or Firm* — Tung & Associates

(57) ABSTRACT

The present invention discloses a PWM signal generation circuit and a PWM signal generation method. The PWM signal generation circuit includes: a reference signal generation circuit for generating a reference signal according to an input voltage; a variable ramp signal generation circuit for generating a variable ramp signal; and a comparator circuit for comparing the reference signal with the variable ramp signal to generate a PWM signal. A rising slope and/or a falling slope of the variable ramp signal is variable.

9 Claims, 9 Drawing Sheets

PULSE WIDTH MODULATION SIGNAL GENERATION CIRCUIT AND PULSE WIDTH MODULATION SIGNAL GENERATION METHOD

CROSS REFERENCE

The present invention claims priority to TW 102102764, filed on Jan. 25, 2013.

BACKGROUND OF THE INVENTION

1. Field of Invention

The present invention relates to a pulse width modulation (PWM) signal generation circuit and a PWM signal generation method; particularly, it relates to such PWM signal generation circuit and PWM signal generation method capable of determining a duty ratio of the PWM signal by adjusting a slope of a variable ramp signal.

2. Description of Related Art

FIG. 1A shows a schematic diagram of a conventional PWM signal generation circuit 10. As shown in FIG. 1A, the PWM signal generation circuit 10 comprises a reference signal generation circuit 11, a fixed ramp signal generation circuit 13 and a comparator circuit 15. The comparator circuit 15 compares a reference signal Comp with a fixed ramp signal Ramp which has a fixed waveform and a fixed level to generate a PWM signal. The reference signal Comp has a linear relationship with the input voltage Vin, and the ramp signal Ramp is a triangle wave or a sawtooth wave having a fixed slope and a fixed amplitude.

FIG. 1B illustrates the signal waveforms corresponding to the conventional PWM signal generation circuit 10 of FIG. 1A. To adjust the duty ratio of a generated PWM signal, this conventional PWM signal generation circuit 10 linearly adjusts the level of the reference signal Comp. That is, referring to FIG. 1B, by providing a different reference signal Comp (e.g., the reference signal Comp 1 is changed to the reference signal Comp 2, as shown in the figure) in the comparator circuit 15 to be compared with the ramp signal Ramp having a fixed waveform and a fixed level, a different PWM signal having a different duty ratio is generated (e.g., from PWM 1 to PWM 2). In other words, in the conventional PWM signal generation circuit 10, the duty ratio of the generated PWM signal can be adjusted by adjusting the level of the input voltage Vin (because the reference signal Comp has a linear relationship with the input voltage Vin).

The drawback of the above-mentioned prior art is that there is only one controllable parameter for adjusting the duty ratio of the PWM signal, which is to adjust the level of the input voltage Vin, and the adjustment of the input voltage Vin can only adjust the duty ratio of the PWM signal in a linear way. In applications requiring more sophisticated control, such as in controlling the rotation speed of a DC motor, when it is required to control the rotation speed of the DC motor more dynamically and more precisely, the conventional PWM signal generation circuit 10 shown in FIG. 1A fails to fulfill the requirement.

To overcome the above-mentioned drawback, U.S. Pat. No. 7,772,903 has proposed a circuit. FIG. 2 illustrates the signal waveforms corresponding to the circuit of U.S. Pat. No. 7,772,903. This prior art adjusts the duty ratio of the PWM signal by adjusting the level of the ramp signal. As shown in FIG. 2, the slope and the amplitude of the ramp signal OSC2 are the same as the slope and the amplitude of the ramp signal OSC1, but the level (as shown by the positions of the peak and the valley) of the ramp signal OSC1 is different from the level of the ramp signal OSC2. Thus, comparing the reference signal Comp with two different ramp signals OSC1 or OSC2 will generate PWM signals of different duty ratios. In other words, in this prior art, if it is desired to adjust the duty ratio of the generated PWM signal, not only the level of the input voltage Vin but also the level of the ramp signal can be used as controllable parameters. As compared with the prior art shown in FIGS. 1A-1B, this prior art has one additional controllable parameter so it can provide more flexible and more precise control.

The drawback of this prior art is that there is an upper limit for the peak and/or a lower limit for the valley of the ramp signal by the nature of the ramp signal generator, so the level of the ramp signal can be adjusted only within a limited range. When the level of the input voltage Vin causes the reference signal Comp to be near the aforementioned upper limit or lower limit, because the ramp signal can not be adjusted to a desired level, the circuit can not generate a PWM signal having a desired duty ratio. In other words, this prior art can not provide rail-to-rail (full range) operation and control.

In view of the above, to overcome the drawbacks in the prior art circuits, the present invention proposes a PWM signal generation circuit and a PWM signal generation method capable of providing flexible and full range operation and control.

SUMMARY OF THE INVENTION

From one perspective, the present invention provides a PWM signal generation circuit, comprising: a reference signal generation circuit for generating a reference signal according to an input voltage; a variable ramp signal generation circuit for generating a variable ramp signal, wherein a rising slope and/or a falling slope of the variable ramp signal is variable; and a comparator circuit electrically connected to the reference signal generation circuit and the variable ramp signal generation circuit, for comparing the reference signal with the variable ramp signal to generate a PWM signal. The variable ramp signal has a fixed frequency or a variable frequency, and, preferably, the variable ramp signal has a fixed peak level.

In one embodiment, the variable ramp signal generation circuit determines a duty ratio of the PWM signal by adjusting the slope of the variable ramp signal, wherein the duty ratio is 100% or 0% when the reference signal is higher than the peak.

In one embodiment, the variable ramp signal generation circuit includes: a peak setting circuit for generating a peak setting signal; a slope setting circuit for generating a slope setting signal; and a basic ramp circuit electrically connected to the peak setting circuit and the slope setting circuit, for generating the variable ramp signal according to the peak setting signal and the slope setting signal, wherein the peak level of the variable ramp signal is determined according to the peak setting signal and the rising slope or the falling slope of the variable ramp signal is determined according to the slope setting signal.

In one embodiment, the basic ramp circuit includes a current source and a capacitor. The current source charges the capacitor to determine the rising slope or discharges the capacitor to determine the falling slope; and the slope setting signal of the slope setting circuit controls a current of the current source.

In one embodiment, the peak setting circuit includes a peak comparator circuit for comparing a voltage of the capacitor with a peak reference voltage to generate the peak setting signal. In another embodiment, the peak setting circuit includes a voltage follower circuit, for determining the peak setting signal according to a peak reference voltage.

In one embodiment, the basic ramp circuit includes a current source and a first capacitor. The current source charges the first capacitor to determine the rising slope or discharges the first capacitor to determine the falling slope. The PWM signal generation circuit further comprises a clock signal generation circuit, wherein the clock signal generation circuit includes a second capacitor and a clock signal comparator circuit. The current source charges or discharges the second capacitor, and the clock signal comparator circuit compares a voltage of the second capacitor with a reference level to generate a clock signal.

From another perspective, the present invention provides a PWM signal generation method, comprising: generating a reference signal according to an input voltage; generating a variable ramp signal having a fixed peak level, wherein a rising slope and/or a falling slope of the variable ramp signal is variable; and comparing the reference signal with the variable ramp signal to generate a PWM signal.

The objectives, technical details, features, and effects of the present invention will be better understood with regard to the detailed description of the embodiments below, with reference to the attached drawings.

DESCRIPTION OF THE PREFERRED EMBODIMENTS

Figure 3:
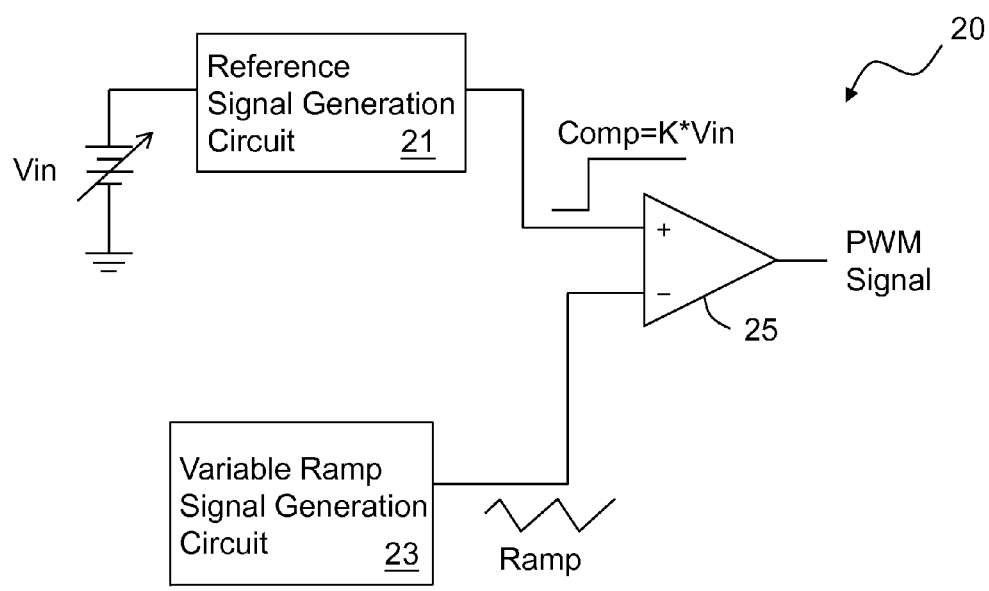
FIG. 3 shows a schematic diagram of a PWM signal generation circuit 20 according to an embodiment of the present invention.
Figure 4A:
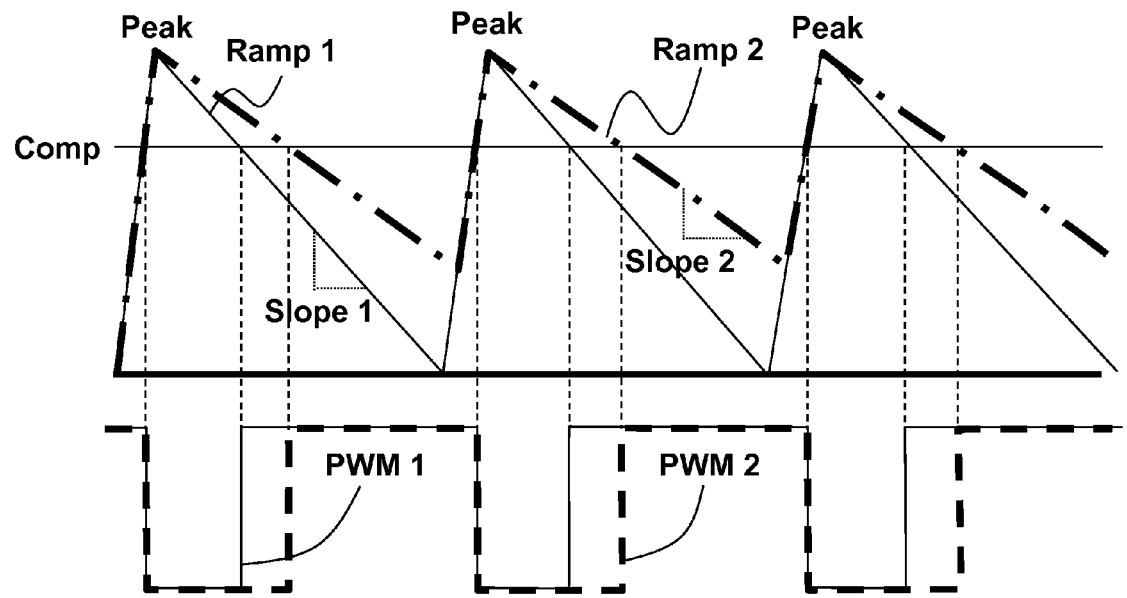
FIGS. 4A-4C and 5A-5B show several embodiments of the variable ramp signal.

Please refer to FIG. 3 and FIG. 4A, which show a first embodiment of the present invention. This embodiment shows an example of an application structure where the present invention can be applied to. As shown in FIG. 3, the PWM signal generation circuit 20 comprises a reference signal generation circuit 21, a variable ramp signal generation circuit 23 and a comparator circuit 25. The reference signal generation circuit 21 generates a reference signal Comp according to an input voltage Vin, wherein the reference signal Comp and the input voltage Vin for example have a linear relationship represented by the following equation:

$$Comp = K \times Vin$$

wherein K is, for example, a constant.

The variable ramp signal generation circuit 23 generates a variable ramp signal Ramp, wherein the slope of the variable ramp signal Ramp is variable and the amplitude of the variable ramp signal Ramp can also (optionally but not necessarily) be adjustable. The slope and the amplitude of the variable ramp signal Ramp can be determined by a slope setting signal and a peak setting signal, respectively. The comparator circuit 25 is electrically connected to the reference signal generation circuit 21 and the variable ramp signal generation circuit 23, and it compares the reference signal Comp with the variable ramp signal Ramp to generate a PWM signal.

This embodiment is different from the prior art in that the variable ramp signal Ramp generated by the variable ramp signal generation circuit 23 has a variable slope and its amplitude can also be adjusted. Therefore, the duty ratio of the PWM signal is controlled in a way different from that described in the prior art. The differences will be explained with reference to the signal waveforms of FIG. 4A as an example; however, it should be understood that the signal waveforms shown in FIG. 4A are only an illustrative example, but not for limiting the scope of the present invention.

Figure 4B:
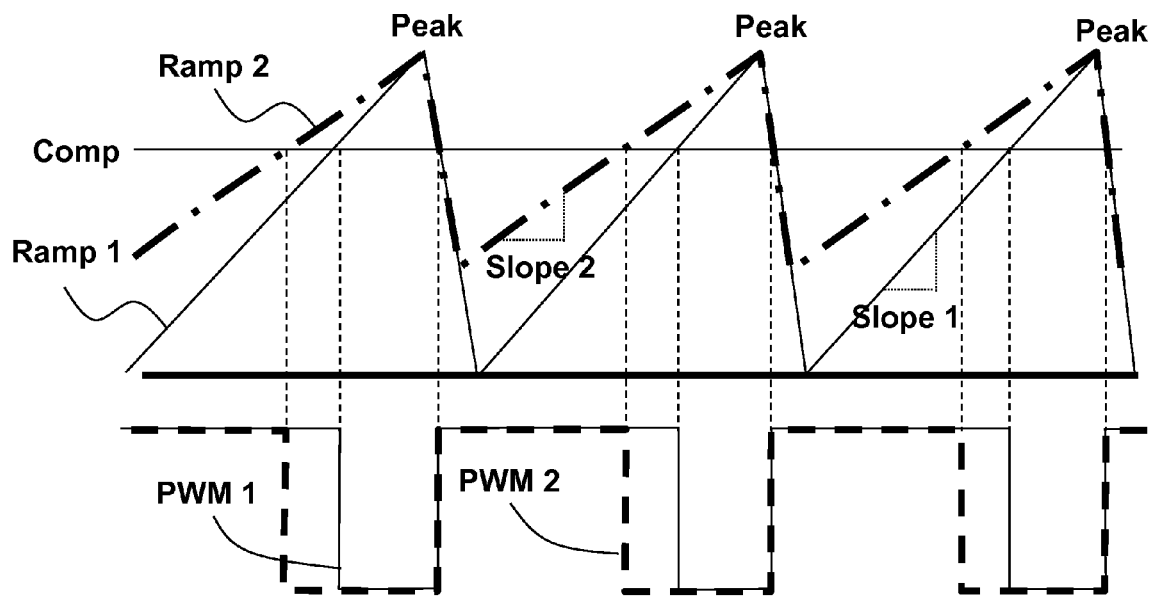
Figure 4C:
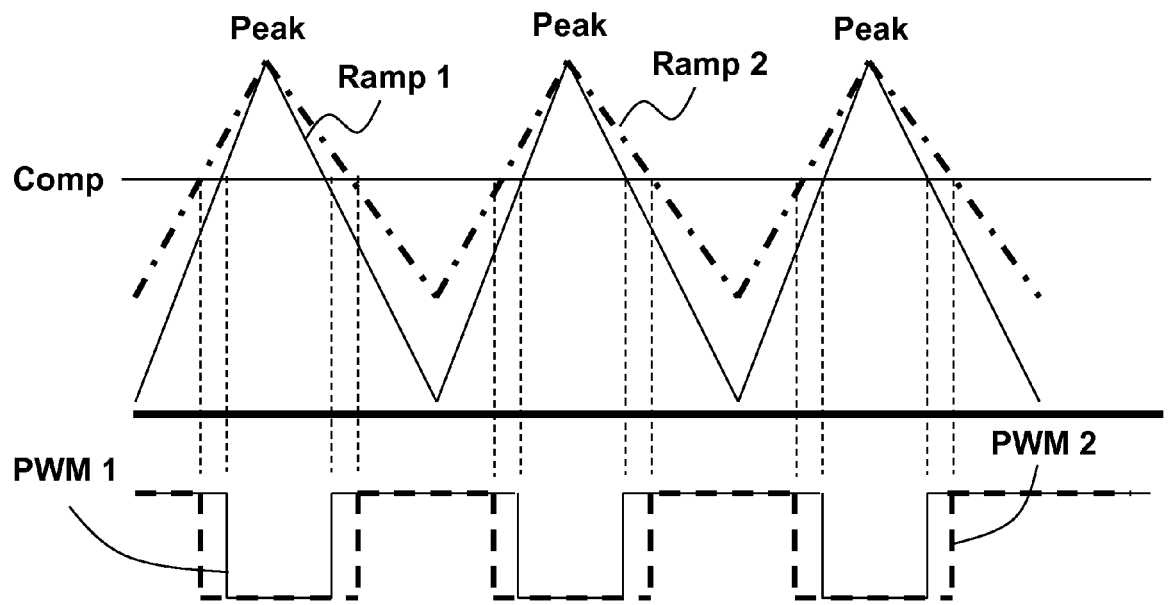

Referring to FIG. 4A, the variable ramp signal generation circuit 23 can generate different variable ramp signals, for example, the variable ramp signals Ramp 1 and Ramp 2 (only two variable ramp signals are shown here for simplicity; certainly, it should be understood that the variable ramp signal generation circuit 23 can generate more than two different variable ramp signals). When the different variable ramp signals Ramp 1 and Ramp 2 are compared with the reference signal Comp, different PWM signals having different duty ratios are generated, namely the PWM signal PWM 1 and the PWM signal PWM 2. As shown in FIG. 4A, the variable ramp signals Ramp 1 and Ramp 2 have different slopes, namely Slope 1 and Slope 2, respectively. In this embodiment, Slope 1 and Slope 2 are different falling slopes, while the variable ramp signals Ramp 1 and Ramp 2 have the same rising slope. In other embodiments, the variable ramp signals Ramp 1 and Ramp 2 can have different rising slopes but the same falling slope (as shown in FIG. 4B). Or, the variable ramp signals Ramp 1 and Ramp 2 can have both different rising slopes and different falling slopes (as shown in FIG. 4C). The peaks of the variable ramp signals Ramp 1 and Ramp 2 can be determined by the peak setting signal, and the rising slope and/or the falling slope of the variable ramp signals Ramp 1 and Ramp 2 can be determined by the slope setting signal (details will be discussed later). In addition, in this embodiment, the variable ramp signals Ramp 1 and Ramp 2 preferably have the same peak level (Peak). That is, after determined by the peak setting signal, the peak level (Peak) is fixed, so as to avoid the drawback in the prior art which can not operate in full range.

Please refer to FIG. 4A. Because Slope 1 and Slope 2 are different, the variable ramp signals Ramp 1 and Ramp 2 will generate PWM signals having different duty ratios (i.e., the PWM signals PWM 1 and PWM 2) as the variable ramp signals Ramp 1 and Ramp 2 are compared with the reference signal Comp. In other words, the variable ramp signal generation circuit 23 can adjust the duty ratio of the generated PWM signal by adjusting the slope of the variable ramp signal outputted from it, and the duty ratio will be 100% or 0% when the level of the reference signal Comp is higher than the peak level (Peak). For example, it can be inferred from FIG. 4A that, when the level of the reference signal Comp is higher than the 1 peak level (Peak), the duty ratio will be 100%; if the positive and negative terminals of the comparator circuit 25 are interchanged, the duty ratio will be 0%.

Figure 5A:
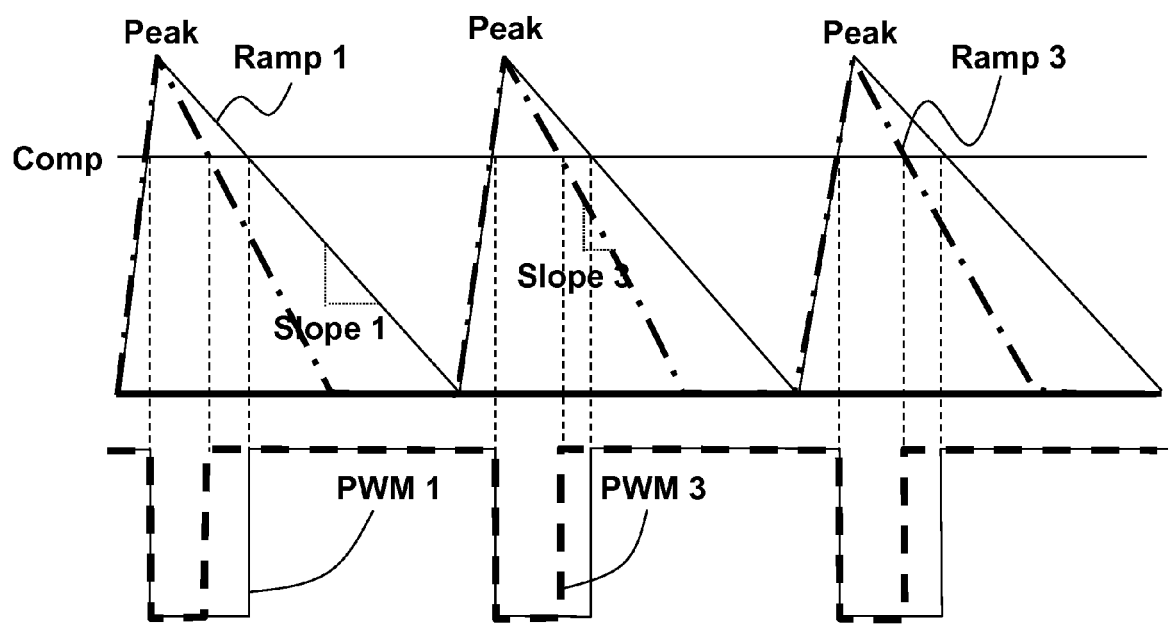
Figure 5B:
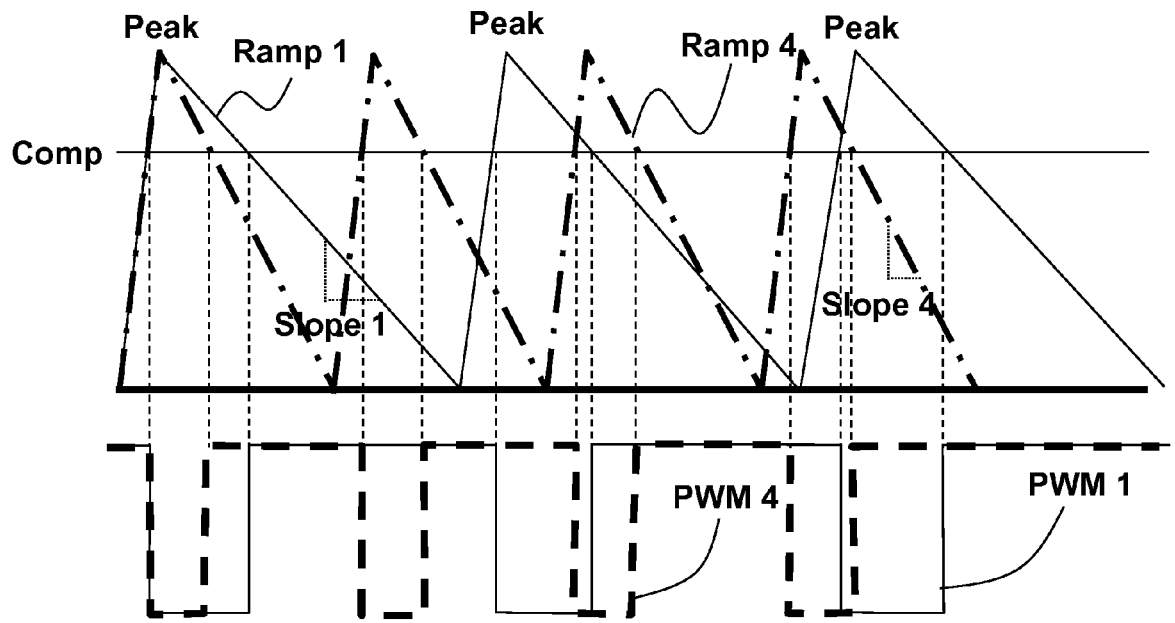

FIGS. 5A and 5B show that the variable ramp signal can have a fixed frequency or a variable frequency (that is, as the slope of the variable ramp signal is changed, the variable ramp signal having the original slope and the variable ramp signal having the changed slope can have the same or different frequency). FIG. 5A shows that the variable ramp signal has a fixed frequency (that is, the variable ramp signal having the original slope and the variable ramp signal having the changed slope have the same frequency). In the embodiment of FIG. 5A, the variable ramp signal Ramp 1 has a falling slope Slope 1 and the variable ramp signal generation circuit 23 adjusts the falling slope Slope 1 to generate the variable ramp signal Ramp 3 having the falling slope Slope 3, but the variable ramp signal generation circuit 23 keeps the frequency of the variable ramp signal Ramp3 unchanged and it is the same as the frequency of the variable ramp signal Ramp 1. Thus, the signal waveform of the variable ramp signal Ramp 3 is as shown in FIG. 5A. The PWM signals generated by comparing the variable ramp signals Ramp 1 and Ramp 3 with the reference signal Comp, namely the PWM signals PWM 1 and PWM 3, will have the same frequency but different duty ratios.

On the other hand, FIG. 5B shows that the variable ramp signal has a variable frequency (that is, the variable ramp signal having the original slope and the variable ramp signal having the changed slope have different frequencies). As shown in FIG. 5B, the variable ramp signal Ramp 1 has a falling slope Slope 1 and the variable ramp signal generation circuit 23 adjusts the falling slope Slope 1 to generate the variable ramp signal Ramp 4 having the falling slope Slope 4. In addition, the variable ramp signal generation circuit 23 also changes the frequency of the variable ramp signal Ramp4 so that it is different from the frequency of the variable ramp signal Ramp 1. Thus, the signal waveform of the variable ramp signal Ramp 4 is as shown in FIG. 5B. The PWM signals generated by comparing the variable ramp signals Ramp 1 and Ramp 4 with the reference signal Comp, namely the PWM signals PWM 1 and PWM 4, will have different frequencies and different duty ratios.

Figure 6A:
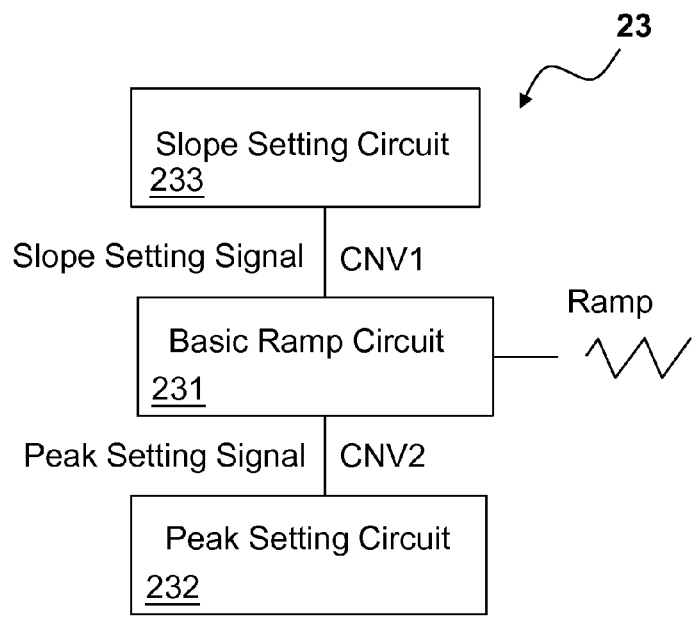
FIG. 6A shows an embodiment of a variable ramp signal generation circuit of the present invention.
Figure 6B:
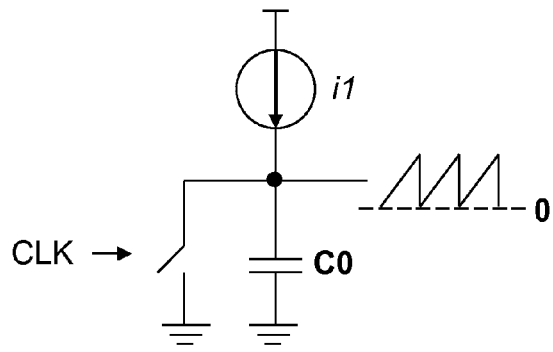
FIGS. 6B-6D show several embodiments of a basic ramp circuit.
Figure 6C:
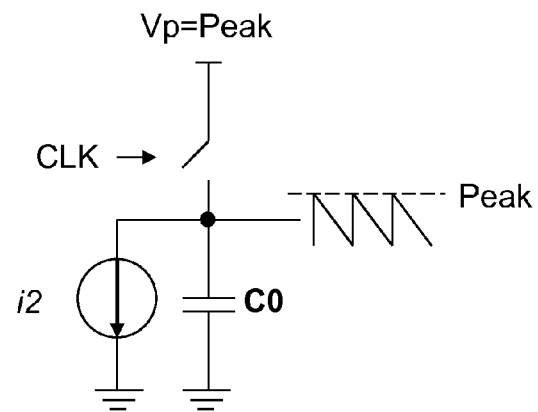
Figure 6D:
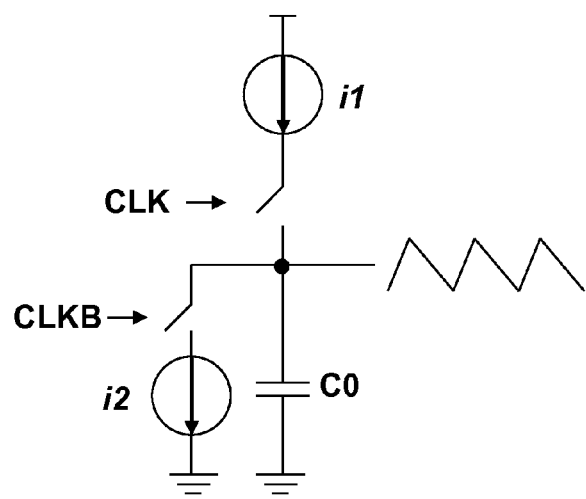

FIG. 6A shows an embodiment of the variable ramp signal generation circuit 23 of the present invention. As shown in FIG. 6A, the variable ramp signal generation circuit 23 comprises a basic ramp circuit 231, a peak setting circuit 232 and a slope setting circuit 233. The basic ramp circuit 231 for example can be embodied as shown in FIGS. 6B-6D. Any one of these circuits can generate a ramp signal on the capacitor C0. In FIG. 6B, the current i1 determines the rising slope of the ramp signal and the clock signal CLK determines the peak of the ramp signal (the amplitude is thus determined). In FIG. 6C, the current i2 determines the falling slope of the ramp signal and the clock signal CLK determines the valley of the ramp signal (the amplitude is thus determined). In FIG. 6D, the current i1 determines the rising slope of the ramp signal; the current i2 determines the falling slope of the ramp signal; the clock signal CLK determines the peak of the ramp signal; the inverted clock signal CLKB determines the valley of the ramp signal; the clock signal CLK and the inverted clock signal CLKB determine the amplitude together. In light of the above, the slope of the ramp signal can be adjusted by adjusting the current, and the peak or valley and the amplitude of the ramp signal can be adjusted by controlling the clock signal. In addition, it should be noted that in FIG. 6B and FIG. 6C, a switch controlled by the inverted clock signal CLKB can be disposed between the current source and the capacitor C0. Referring back to FIG. 6A, in this embodiment, the basic ramp circuit 231 is electrically connected to the peak setting circuit 232 and the slope setting circuit 233, and it generates the variable ramp signal Ramp according to the slope setting signal CNV1 generated by the slope setting circuit 233 and the peak setting signal CNV2 generated by the peak setting circuit 232.

Figure 7:
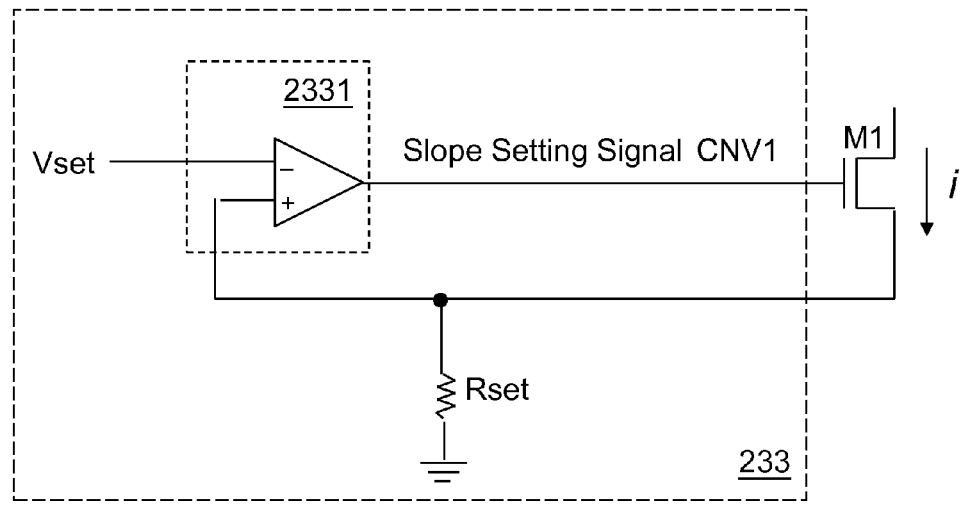
FIG. 7 shows a specific embodiment of a slope setting circuit 233.

FIG. 7 shows a specific embodiment of a slope setting circuit 233. As shown in FIG. 7, the slope setting circuit 233 includes an amplifier circuit 2331. The amplifier circuit 2331 compares a setting voltage Vset with a voltage difference across a setting resistor Rset, to output the slope setting signal CNV1. The slope setting signal CNV1 controls a transistor M1 to generate a current i, and the current i can be duplicated by a current mirror circuit (not shown) to generate the current i1 or i2 shown in FIGS. 6B-6D. In other words, the transistor M1 (or the transistor M1 plus the current mirror circuit) corresponds to the current source shown in FIGS. 6B-6D. Since i=Vset/Rset, the current i can be adjusted if Vset or Rset is adjusted, and the slope of the variable ramp signal Ramp can be adjusted accordingly.

Figure 8A:
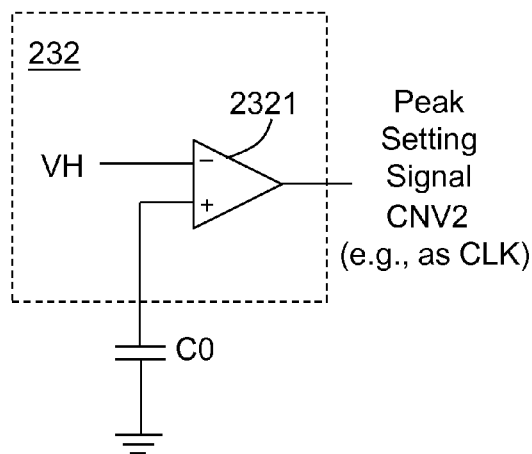
FIG. 8A shows a specific embodiment of a peak setting circuit 232.

FIG. 8A shows a specific embodiment of a peak setting circuit 232. In FIGS. 6B and 6D, the clock signal CLK determines the peal value of the ramp signal. Accordingly, as shown in FIG. 8A, the peak setting circuit 232 can include a comparator circuit 2321. The comparator circuit 2321 compares the voltage of the capacitor C0 shown in FIGS. 6B and 6D with a peak reference voltage VH corresponding to the peak level (Peak) and outputs the peak setting signal CNV2 when the voltage of the capacitor C0 reaches the peak reference voltage VH. This peak setting signal CNV2 can be used as, for example, the clock signal CLK shown in FIGS. 6B and 6D so as to determine the peak level of the ramp signal.

In FIG. 6C, when the clock signal CLK turns ON the switch, a voltage node Vp connected to the upper terminal of the capacitor C0 will determine the peak level of the ramp signal. In other words, it only needs to set the voltage node Vp properly to determine the desired peak level (Peak). However, if the voltage node Vp is not a node capable of supplying charges in the circuit, referring to FIG. 8B, in one embodiment, the peak setting circuit 232 can include a voltage follower circuit which includes an amplifier circuit 2322 and a transistor M2. The output of the amplifier circuit 2322 controls the transistor M2. The current input terminal of the transistor M2 is connected to a power source Vcc capable of supplying charges and the current output terminal of the transistor M2 generates the peak setting signal CNV2. The peak setting signal CNV2 is fed back to one input terminal of the amplifier circuit 2322 to be compared with the peak reference voltage VH. When the circuit is at balance, the peak setting signal CNV2 will be equal to the peak reference voltage VH (assuming that internal mismatch in the amplifier circuit 2322 is ignorable). Thus, the peak setting signal CNV2 in this embodiment can be used as the voltage node Vp or as the peak level (Peak) to determine the peak of the ramp signal. The power source Vcc can come from the input voltage Vin; or, the input voltage Vin can come from the power source Vcc.

Figure 8B:
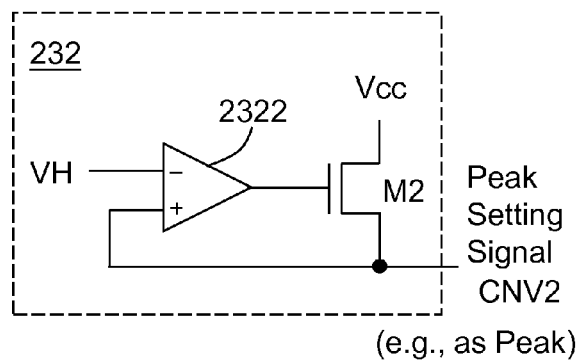
FIG. 8B shows another specific embodiment of a peak setting circuit 232.

The circuit shown in FIG. 8B can be applied not only to the circuit shown in FIG. 6C (wherein the peak setting signal CNV2 is used as the voltage node Vp or as the peak level (Peak)); it also can be applied to the circuit shown in FIG. 6B or 6D (under such circumstance, the transistor M2 corresponds to the current source providing current i1 in FIG. 6B or 6D).

Figure 9:
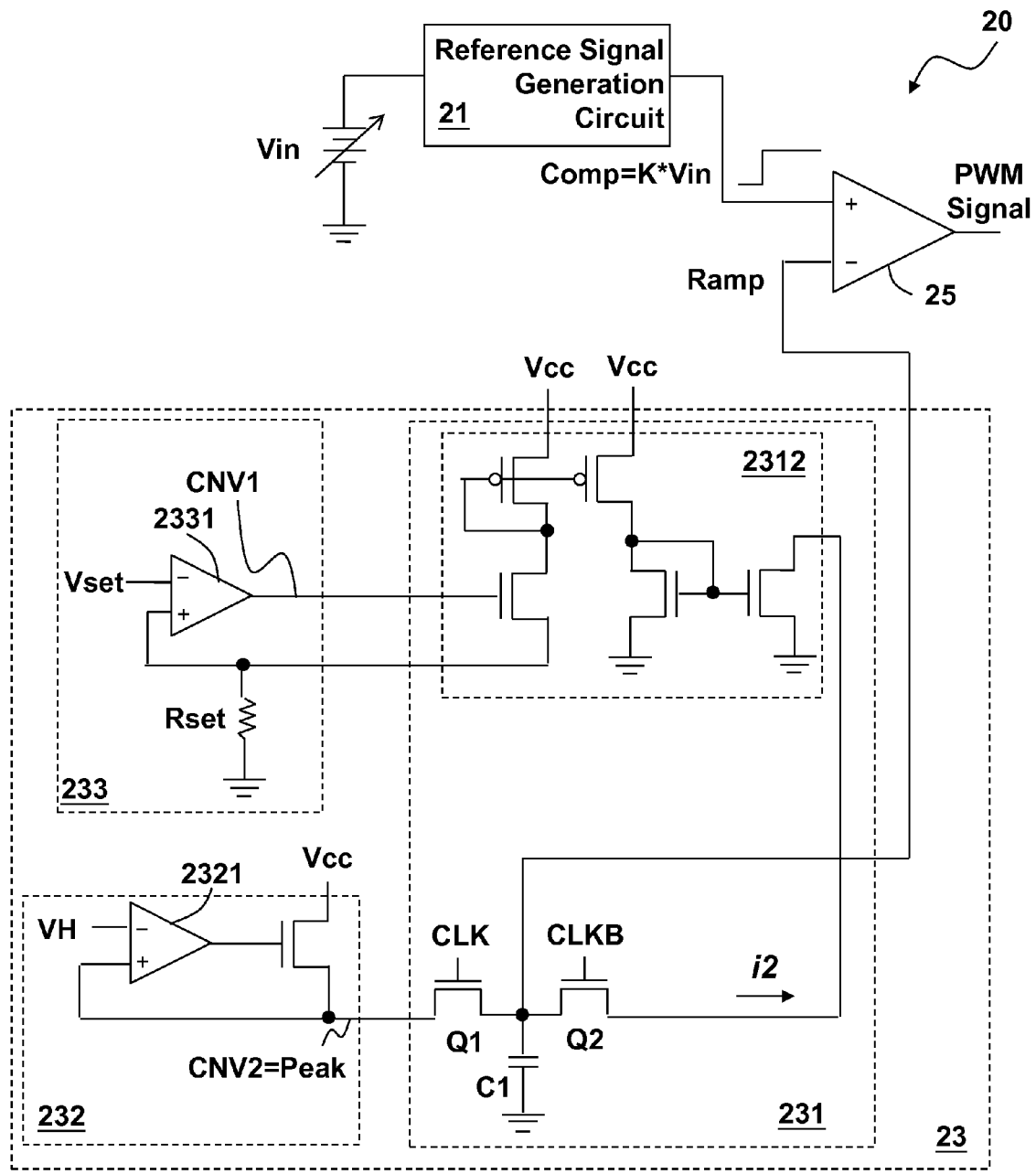
FIG. 9 shows a specific embodiment of a PWM signal generation circuit 20.

FIG. 9 shows a specific embodiment of a PWM signal generation circuit 20. As shown in FIG. 9, the PWM signal generation circuit 20 comprises a reference signal generation circuit 21, a variable ramp signal generation circuit 23 and a comparator circuit 25. Like the first embodiment, the reference signal generation circuit 21 generates a reference signal Comp according to the input voltage Vin, wherein the reference signal Comp and the input voltage Vin for example have a linear relationship represented by the following equation:

$$Comp = K \times Vin$$

wherein K is, for example, a constant. The variable ramp signal generation circuit 23 generates the variable ramp signal Ramp according to the slope setting signal CNV1 and the peak setting signal CNV2. The comparator circuit 25 is electrically connected to the reference signal generation circuit 21 and the variable ramp signal generation circuit 23; it compares the reference signal Comp with the variable ramp signal Ramp to generate a PWM signal.

Still referring to FIG. 9, the variable ramp signal generation circuit 23 includes a basic ramp circuit 231, a peak setting circuit 232 and a slope setting circuit 233. The basic ramp circuit 231 includes, for example but not limited to, a current source 2312, a capacitor C1 and switches Q1 and Q2. The capacitor C1 is connected to the switches Q1 and Q2. The switches Q1 and Q2 respectively receive a clock signal CLK and an inverted clock signal CLKB, wherein the clock signal CLK and the inverted clock signal CLKB are inverted in phase with respect to each other. The peak setting circuit 232 is, for example, a circuit shown in FIG. 8B and the slope setting circuit 233 is, for example, a circuit shown in FIG. 7.

In this embodiment, when the switch Q1 is turned ON, the peak setting signal CNV2 is connected to the capacitor C1 through the switch Q1 to determine the peak of the variable ramp signal Ramp. When the switch Q2 is turned ON, the capacitor C1 is controlled by the current source 2312 to discharge by the current i2, wherein the current i2 is determined by the slope setting signal CNV1. That is, the slope setting signal CNV1 is determined by setting the Vset or Rset, whereby a desired discharging current i2 is determined, which then determines the falling slope of the variable ramp signal Ramp.

The circuit as shown above in FIG. 9 is only one of many possible embodiments. For example, the circuits and the devices FIGS. 6B-6D, 7, 8A-8B can be combined in various ways to form different embodiments. For example, if the rising slope and the falling slope of the variable ramp signal Ramp are both variable, the basic ramp circuit 231 can adopt the structure shown in FIG. 6D and employ two circuits of FIG. 7 to set the rising slope and the falling slope respectively.

Figure 1A:
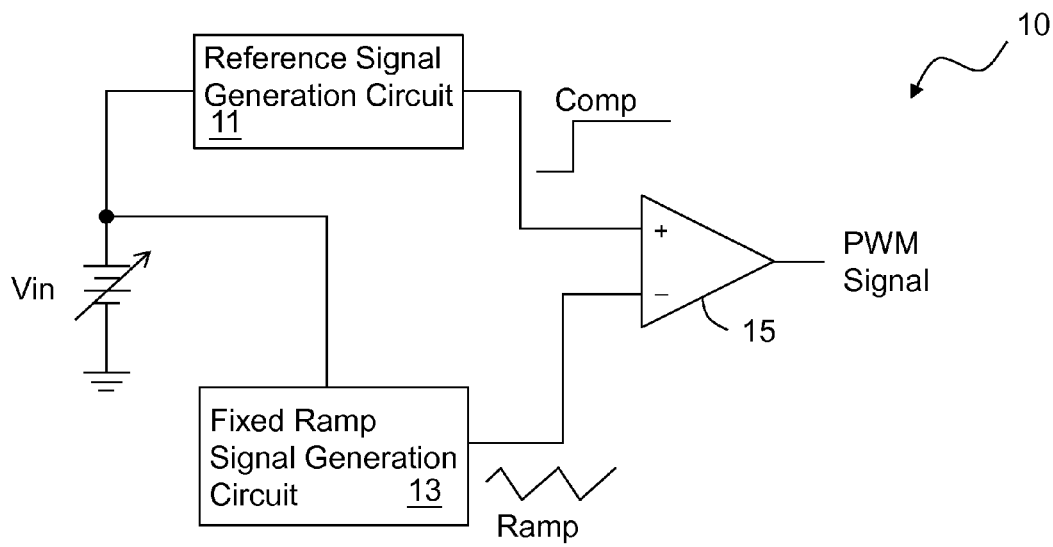
FIG. 1A shows a schematic diagram of a conventional PWM signal generation circuit 10.
Figure 1B:
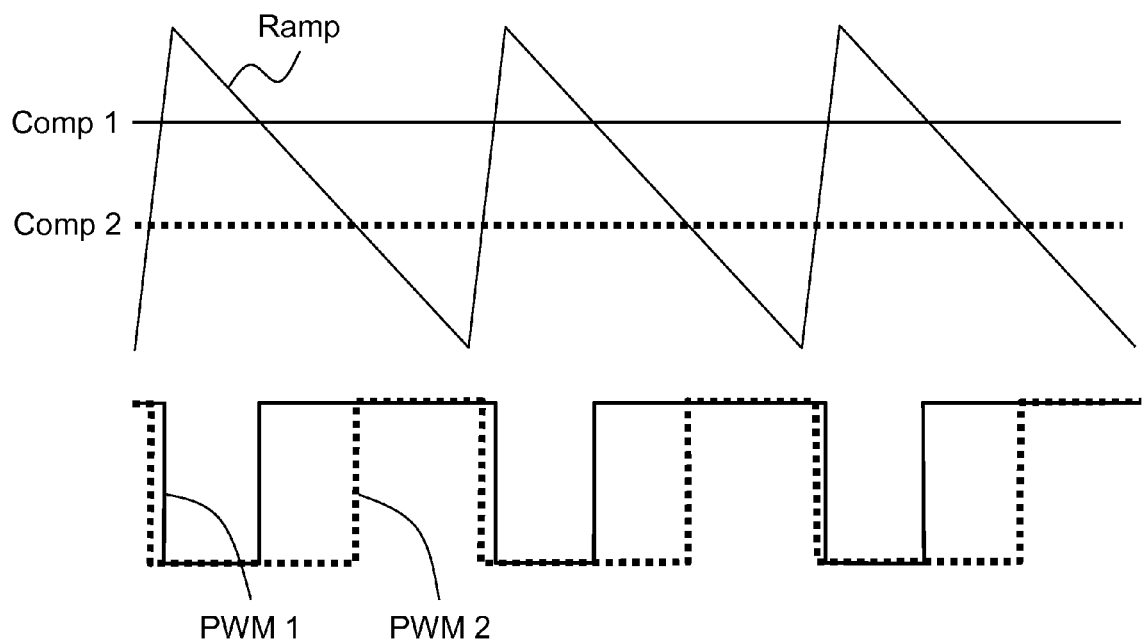
FIG. 1B illustrates the signal waveforms corresponding to the conventional PWM signal generation circuit 10 of FIG. 1A.
Figure 2:
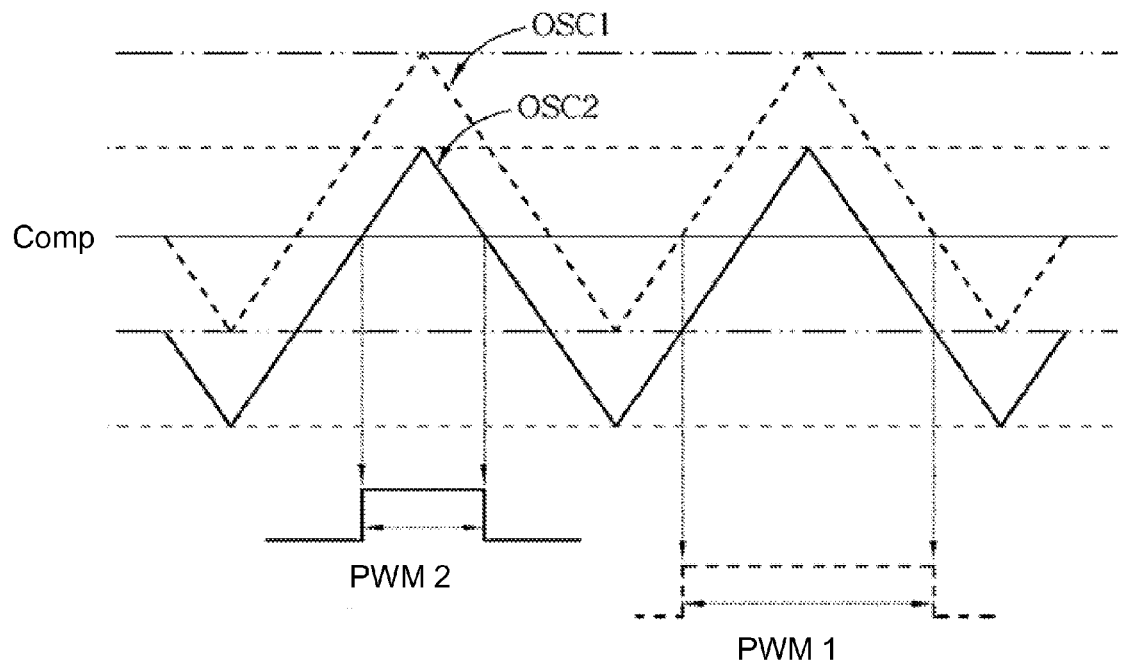
FIG. 2 illustrates the signal waveforms corresponding to the circuit of U.S. Pat. No. 7,772,903.

In each of the above-mentioned embodiments, setting the peak of the variable ramp signal Ramp is only preferred but not necessarily required. Its advantage is: when the peak of the variable ramp signal Ramp is set below a certain upper limit, it means that any reference signal Comp having a level higher than the upper limit does not affect the duty ratio of the PWM signal, and therefore the duty ratio of the PWM signal is not required to be adjusted by the reference signal Comp having a level higher than the upper limit. That is, when the level of the input voltage Vin is high which causes the reference signal Comp to have a level near or higher than the upper limit, the duty ratio of the PWM signal is still correct and will not be distorted. In contrast, in the prior art shown in FIG. 2, when the level of the input voltage Vin is high which causes the corresponding reference signal Comp to have a level near or higher than the upper limit, the duty ratio of the PWM signal is still required to be adjusted according to the reference signal Comp, but the ramp signal can not be accurately shifted to a corresponding high level. Therefore, in the prior art, the duty ratio of the PWM signal is distorted and becomes inaccurate when the level of the input voltage Vin is high.

Figure 10:
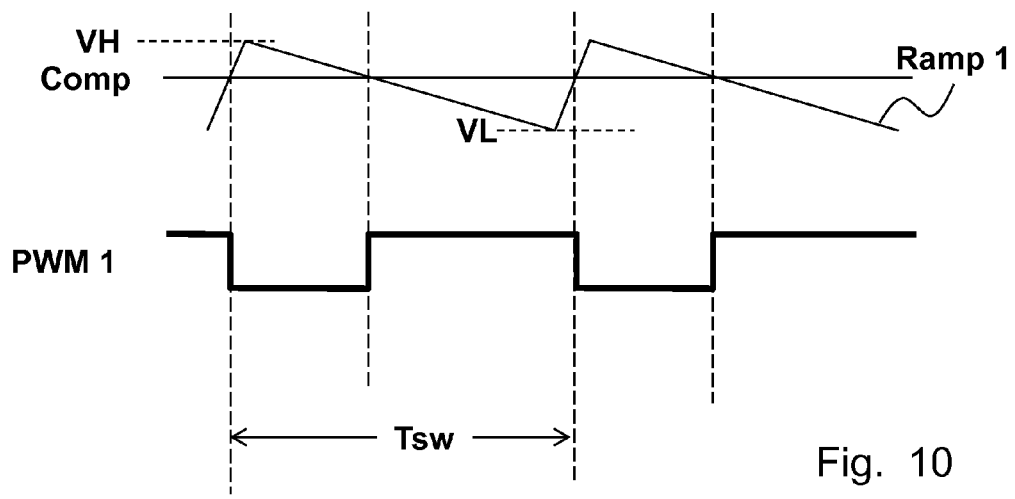
FIG. 10 illustrates the signal waveforms corresponding to the PWM signal generation circuit 20 of FIG. 9.

FIG. 10 illustrates the signal waveforms corresponding to the PWM signal generation circuit 20 of FIG. 9, to explain the application of the present invention. A designer or a user can first determine the peak reference voltage VH (which corresponds to the peak level of the variable ramp signal Ramp), and then conveniently, use a divided voltage of the peak reference voltage VH as the setting voltage Vset to control the duty ratio of the PWM signal. More specifically, referring to FIG. 9, let us assume that the conversion ratio from the setting voltage Vset to the current i2 is Ki, namely i2=Ki×Vset and assume that the lowest level (the valley level) of the variable ramp signal Ramp 1 is VL (referring to FIG. 10). VL is equal to the peak level (VH) minus the amplitude, and the amplitude is equal to the slope of the variable ramp signal Ramp 1 multiplying a percentage of one cycle period Tsw (and converted to a unit by voltage), that is:

$$VL = VH - \frac{Ki \times Vset \times Tsw}{C}$$

wherein Ki, Tsw and C are constants.

Besides, it can be seen from the signal waveforms shown in FIG. 10 that:

When the level of the reference signal Comp is higher than the peak level VH of the variable ramp signal Ramp 1, the duty ratio of the PWM signal PWM1 is 100%;

When the level of the reference signal Comp is lower than the valley level VL of the variable ramp signal Ramp 1, the duty ratio of the PWM signal PWM1 is 0%;

When the level of the reference signal Comp is between the peak level VH and the valley level VL of the variable ramp signal Ramp 1, the duty ratio (Duty) of the PWM signal PWM1 is:

$$\begin{aligned} Duty &= \frac{K \times Vin - VL}{VH - VL} \\ &= \frac{K \times Vin - VH + \frac{Ki \times Vset \times Tsw}{C}}{\frac{Ki \times Vset \times Tsw}{C}} \\ &= 1 + \frac{K \times Vin}{K' \times Vset} - \frac{VH}{K' \times Vset} \end{aligned}$$

wherein Comp=K×Vin, and in the right end of the equation, K and K' are constants, and Vin and VH are known values. In light of the above, first, the duty ratio of the PWM signal PWM1 is dependent on the setting voltage Vset, that is, a designer or a user can adjust the duty ratio of the PWM signal by adjusting the setting voltage Vset. Second, if the setting voltage Vset is set to be a divided voltage of the peak reference voltage VH, the above equation can be further simplified, and it will be more convenient to the designer or user to determine the setting voltage Vset in this way.

Furthermore, please refer to FIG. 7: "to adjust the duty ratio of the PWM signal by adjusting the setting voltage Vset" can also be realized by setting the setting voltage Vset to be a constant (Ki) and adjusting the resistance of the setting resistor Rset, so that a setting current Iset is generated as thus: Iset=Ki/Rset. This setting current can be inputted to the basic ramp circuit 231 to adjust the slope of the variable ramp signal Ramp, such that:

$$VL = VH - \frac{Ki \times Tsw}{Rset \times C}$$

When the level of the reference signal Comp is between the peak level VH and the valley level VL of the variable ramp signal Ramp 1, the duty ratio (Duty) of the PWM signal PWM1 is:

$$\begin{aligned} \text{Duty} &= \frac{K \times Vin - VL}{VH - VL} \\ &= \frac{K \times Vin - VH + \frac{Ki \times Tsw}{Rset \times C}}{\frac{Ki \times Tsw}{Rset \times C}} \\ &= 1 + \frac{K \times Rset \times Vin}{K'} - \frac{VH \times Rset}{K'} \end{aligned}$$

As such, the duty ratio of the PWM signal PWM 1 is dependent on the resistance of the setting resistor Rset, and a designer or a user can adjust the duty ratio (Duty) of the PWM signal by adjusting the resistance of the setting resistor Rset.

Figure 11:
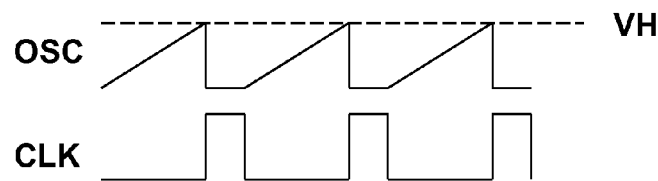
FIG. 11 shows an embodiment of a clock signal generation circuit 100.
Figure 11:
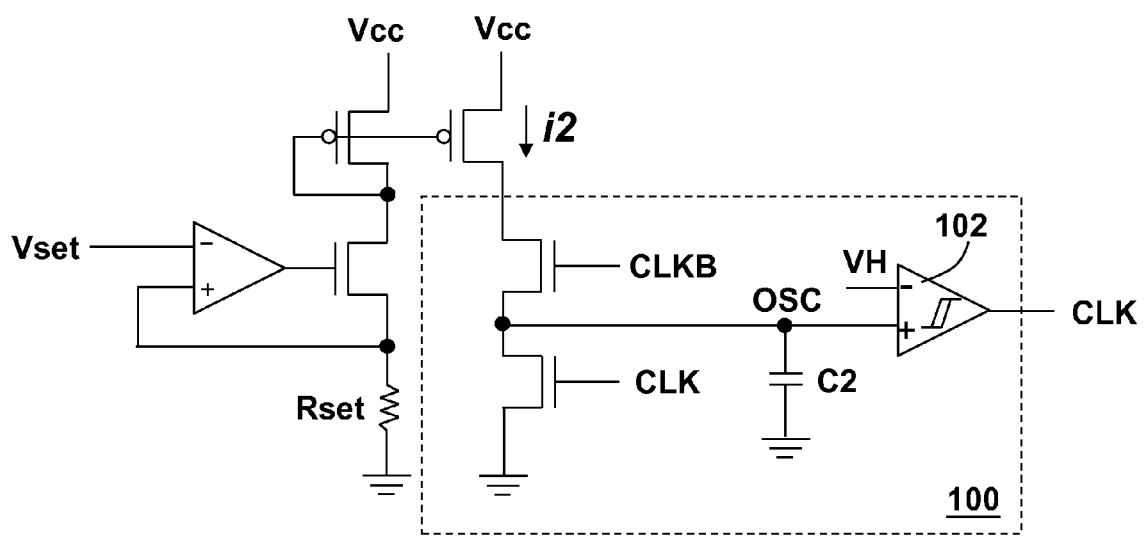

FIG. 11 shows an embodiment of a clock signal generation circuit 100. The clock signal generation circuit 100 uses the current i2 which is readily available in the present invention to charge the capacitor C2. The voltage generated on the node OSC is compared with the peak reference voltage VH by the comparator 102 and the output of the comparator 102 is used as the clock signal CLK. This clock signal CLK and its inverted signal can be used to control the timing of charging the capacitor C2 by the current i2. (The comparator 102 is preferably but not necessarily a hysteresis comparator). This embodiment shows that: first, the present invention can generate the clock signals CLK and CLKB by simple circuits, and does not require a complicated circuit such as an oscillator. Second, in the present invention, it can be arranged so that the clock signals CLK and CLKB are relevant to the setting voltage Vset and the peak reference voltage VH. In this embodiment, the voltage on the node OSC is generated by the charging the capacitor C2. However, referring to FIGS. 6B-6D, this arrangement can be modified; that is, the voltage on the node OSC can be generated by discharging the capacitor C2, or, by alternately charging and discharging the capacitor C2 under control by the clock signals CLK and CLKB. In addition, the reference level as an input to the hysteresis comparator 102 for comparison with the voltage on the node OSC, and the arrangement of the positive and negative input terminals of the hysteresis comparator 102, can be modified depending on practical considerations or preferences. Further, it should be understood that the clock signal generation circuit 100 shown in FIG. 11 is only an illustrative example, but not for limiting the scope of the present invention. The clock signals CLK and CLKB can be generated by any other method, and they do not have to be relevant to the setting voltage Vset and the peak reference voltage VH.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a device (such as a switch) which does not substantially influence the primary function of a signal can be inserted between any two devices shown to be in direct connection in the embodiments. For another example, the positive and negative input terminals of an amplifier circuit or a comparator are interchangeable, with corresponding amendments of the circuits processing these signals. In view of the foregoing, the spirit of the present invention should cover all such and other modifications and variations, which should be interpreted to fall within the scope of the following claims and their equivalents.

What is claimed is:

1. A pulse width modulation (PWM) signal generation circuit, comprising:
   a reference signal generation circuit for generating a reference signal according to an input voltage;
   a variable ramp signal generation circuit for generating a variable ramp signal having a fixed peak level, wherein a rising slope and/or a falling slope of the variable ramp signal is variable and the variable ramp signal generation circuit determines a duty ratio of the PWM signal by adjusting the rising slope and/or the falling slope, and wherein the duty ratio is 100% or 0% when the reference signal is higher than the peak level; and
   a comparator circuit electrically connected to the reference signal generation circuit and the variable ramp signal generation circuit, for comparing the reference signal with the variable ramp signal to generate a PWM signal.

2. The PWM signal generation circuit of claim 1, wherein the variable ramp signal has a fixed frequency or a variable frequency.

3. A pulse width modulation (PWM) signal generation circuit, comprising:
   a reference signal generation circuit for generating a reference signal according to an input voltage;
   a variable ramp signal generation circuit for generating a variable ramp signal having a fixed peak level, wherein a rising slope and/or a falling slope of the variable ramp signal is variable;
   and wherein the variable ramp signal generation circuit includes:
   a peak setting circuit for generating a peak setting signal;
   a slope setting circuit for generating a slope setting signal; and
   a basic ramp circuit electrically connected to the peak setting circuit and the slope setting circuit, for generating the variable ramp signal according to the peak setting signal and the slope setting signal, wherein the peak level of the variable ramp signal is determined according to the peak setting signal and the rising slope or the falling slope of the variable ramp signal is determined according to the slope setting signal; and
   a comparator circuit electrically connected to the reference signal generation circuit and the variable ramp signal generation circuit, for comparing the reference signal with the variable ramp signal to generate a PWM signal.

4. The PWM signal generation circuit of claim 3, wherein the basic ramp circuit includes a current source and a capacitor, the current source charging the capacitor to determine the rising slope or discharging the capacitor to determine the falling slope; and wherein the slope setting signal of the slope setting circuit controls a current of the current source.

5. The PWM signal generation circuit of claim 3, wherein the basic ramp circuit includes a current source and a capacitor, the current source charging the capacitor to determine the rising slope; and wherein the peak setting circuit includes a peak comparator circuit for comparing a voltage of the capacitor with a peak reference voltage to generate the peak setting signal.

6. The PWM signal generation circuit of claim 3, wherein the basic ramp circuit includes a current source and a capacitor, the current source charging the capacitor to determine the rising slope or discharging the capacitor to determine the falling slope; and wherein the peak setting circuit includes a voltage follower circuit for determining the peak setting signal according to a peak reference voltage.

7. The PWM signal generation circuit of claim 3, wherein the basic ramp circuit includes a current source and a first capacitor, the current source charging the first capacitor to determine the rising slope or discharging the first capacitor to determine the falling slope; and wherein the PWM signal generation circuit further comprises a clock signal generation circuit which includes:
- a second capacitor charged or discharged by the current source, and
- a clock signal comparator circuit for comparing a voltage of the second capacitor with a reference level to generate a clock signal.

8. A pulse width modulation (PWM) signal generation method, comprising:
- generating a reference signal according to an input voltage;
- generating a variable ramp signal having a fixed peak level, wherein a rising slope and/or a falling slope of the variable ramp signal is variable;
- and wherein the step of generating the variable ramp signal includes:
  - charging a first capacitor by a current source to determine the rising slope of the variable ramp signal or discharging a first capacitor by a current source to determine the falling slope of the variable ramp signal;
  - charging or discharging a second capacitor by the current source; and
  - comparing a voltage of the second capacitor with a reference level to generate a clock signal; and
- comparing the reference signal with the variable ramp signal to generate a PWM signal.

9. The PWM signal generation method of claim 8, wherein the variable ramp signal has a fixed frequency or a variable frequency.

* * * * *